(12) United States Patent
Guo et al.

(10) Patent No.: US 11,732,346 B2
(45) Date of Patent: Aug. 22, 2023

(54) PHYSICAL VAPOR DEPOSITION CHAMBER AND PHYSICAL VAPOR DEPOSITION APPARATUS

(71) Applicant: BEIJING NAURA MICROELECTRONICS EQUIPMENT CO., LTD., Beijing (CN)

(72) Inventors: Hongrui Guo, Beijing (CN); Bing Li, Beijing (CN); Qiwei Huang, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 0 days.

(21) Appl. No.: 17/773,678

(22) PCT Filed: Oct. 23, 2020

(86) PCT No.: PCT/CN2020/123065
§ 371 (c)(1),
(2) Date: May 2, 2022

(87) PCT Pub. No.: WO2021/088658
PCT Pub. Date: May 14, 2021

(65) Prior Publication Data
US 2022/0380887 A1 Dec. 1, 2022

(30) Foreign Application Priority Data
Nov. 4, 2019 (CN) .......................... 201911067926.1

(51) Int. Cl.
*H01J 37/34* (2006.01)
*C23C 14/35* (2006.01)

(52) U.S. Cl.
CPC .......... *C23C 14/35* (2013.01); *H01J 37/3405* (2013.01); *H01J 37/3488* (2013.01)

(58) Field of Classification Search
CPC ... C23C 14/35; H01J 37/3405; H01J 37/3488; H01J 37/3414; H01J 37/3435; H01J 37/345; H01J 37/3452; H01J 37/3455
(Continued)

(56) References Cited

U.S. PATENT DOCUMENTS 5,656,091 A * 8/1997 Lee .................. H01J 37/32706
118/723 VE

FOREIGN PATENT DOCUMENTS

CN 1890399 A 1/2007
CN 101280420 A 10/2008
(Continued)

OTHER PUBLICATIONS

The World Intellectual Property Organization (WIPO) International Search Report for PCT/CN2020/123065 dated Dec. 30, 2020 6 Pages (including translation).

*Primary Examiner* — Rodney G McDonald
(74) *Attorney, Agent, or Firm* — Anova Law Group, PLLC

(57) ABSTRACT

Embodiments of the present disclosure disclose a physical vapor deposition (PVD) chamber and a PVD apparatus. The PVD chamber includes a chamber body. An upper electrode assembly is arranged in the chamber body. The upper electrode assembly includes a base plate assembly for carrying a magnetron, a backplate arranged at an interval with the base plate assembly, and a connection assembly that connects the base plate assembly to the backplate. The connection assembly is connected to the base plate assembly. The connection assembly is threadedly connected to the backplate, so that the interval between the base plate assem-
(Continued)

bly and the backplate can be adjusted by moving the connection assembly relative to the backplate. The PVD chamber and the PVD apparatus of embodiments of the present disclosure can conveniently adjust a size of a target magnetic gap between the base plate assembly and the target according to requirements or actual conditions.

18 Claims, 8 Drawing Sheets

(58) Field of Classification Search
USPC ............... 204/298.12, 298.13, 298.2, 298.19
See application file for complete search history.

(56) References Cited

FOREIGN PATENT DOCUMENTS

| | | |
|---|---|---|
| CN | 102226269 A | 10/2011 |
| CN | 203096163 U | 7/2013 |
| CN | 105154839 A | 12/2015 |
| CN | 108754441 A | 11/2018 |
| CN | 110885965 A | 3/2020 |
| JP | 1980100981 A | 8/1980 |
| JP | H08165569 A | 6/1996 |

* cited by examiner

PHYSICAL VAPOR DEPOSITION CHAMBER AND PHYSICAL VAPOR DEPOSITION APPARATUS

CROSS-REFERENCE TO RELATED APPLICATIONS

This application is a national phase entry under 35 U.S.C. § 371 of International Application No. PCT/CN2020/123065, filed on Oct. 23, 2020, which claims priority to Chinese Application No. 201911067926.1 filed Nov. 4, 2019, the entire contents of all of which are incorporated herein by reference.

TECHNICAL FIELD

The present disclosure generally relates to the semiconductor manufacturing field and, more particularly, to a physical vapor deposition (PVD) chamber and a PVD apparatus.

BACKGROUND

In the manufacturing process of a semiconductor integrated circuit, a physical vapor deposition apparatus is usually applied to manufacture a variety of different metal layers and related material layers. A magnetron sputtering apparatus is most widely used.

In a chamber of the magnetron sputtering apparatus, a magnetron and a target are included. The magnetron is arranged close to the target to apply a magnetic field force to atoms that escape from the target to drive the atoms to a predetermined deposition position. In addition, a target magnetic gap exists between the magnetron and the target. When a size of the target magnetic gap is different, a magnitude of the magnetic field force is also different. Thus, an appropriate size of the target magnetic gap needs to be set according to requirements or actual conditions to enable the atoms to form a film well at a predetermined deposition position.

However, the chamber structure of the existing magnetron sputtering apparatus has a problem that the size of the target magnetic gap is not able to be adjusted or is difficult to adjust.

SUMMARY

Embodiments of the present disclosure aim to solve at least one of the technical problems in the existing technology and provide a physical vapor deposition (PVD) chamber and a PVD apparatus. A size of a target magnetic gap can be conveniently adjusted between a base plate assembly and a target according to requirements or actual conditions.

To achieve the above purpose, a first aspect of embodiments of the present disclosure provides a PVD chamber, including a chamber body. An upper electrode assembly may be arranged in the chamber body. The upper electrode assembly may include a base plate assembly that is configured to carry a magnetron, a backplate arranged at an interval from the base plate assembly, and a connection assembly that connects the base plate assembly and the backplate.

The connection assembly may be connected to a base plate assembly. The connection assembly may be threadedly connected to the backplate. Thus, an interval between the base plate assembly and the backplate may be adjusted by moving the connection assembly relative to the backplate.

In one embodiment, the connection assembly may include a connection bolt. The connection bolt may include a bolt head and a bolt. The bolt head may be connected to the base plate assembly, and the bolt may be threadedly connected to the backplate.

In one embodiment, the bolt head may be rotatably connected to the base plate assembly.

In one embodiment, the bolt head may be configured as a convex spherical surface.

The base plate assembly may include a base plate body. A first groove with a first concave spherical surface may be arranged in the base plate body. The bolt head may be arranged in the first groove. The convex spherical surface may adapt to the concave spherical surface.

In one embodiment, an opening end of the first groove may be located on a first surface of the base plate body opposite to the backplate. The bolt may be located outside the base plate body and threadedly connected to the backplate. In some other embodiments, the opening end of the first groove may be located inside the base plate body. A through-hole may be provided in the base plate body. One end of the through-hole may be communicated with the opening end of the first groove. The other end may be located on the first surface. A diameter of the through-hole may be smaller than a diameter of the convex spherical surface. The bolt may extend from the through-hole and be threadedly connected to the backplate.

In one embodiment, the base plate assembly may further include a fixing module. The fixing module may be detachably connected to the base plate body. The fixing module may be provided with a second groove with a second concave spherical surface. The second concave spherical surface may be aligned with the first concave spherical surface to form a continuous concave spherical surface. The bolt head may be fixed between the first groove and the second groove. The convex spherical surface may adapt to the concave spherical surface and the second concave spherical surface.

In one embodiment, a recess may be formed on the base plate body. The fixing module may be embedded in the recess. A surface of the fixing module exposed to the base plate body may be flush with a second surface of the base plate body away from the first surface.

In one embodiment, an operation hole may be arranged on the fixing module. One end of the operation hole may be communicated with the second groove. The other end may be located on the surface of the fixing module exposed to the base plate body. An operation slot corresponding to the operation hole may be arranged on the bolt head.

In one embodiment, a plurality of the connection assemblies may be included. The plurality of connection assemblies may be arranged at intervals. Each of the connection assemblies may be staggered from the magnetron.

A second aspect of embodiments of the present disclosure provides a PVD apparatus, including the PVD chamber as described above.

Compared with the existing technology, beneficial effects of embodiments of the present disclosure are as follows.

In the PVD chamber of embodiments of the present disclosure, by connecting the connection assembly to the base plate assembly and threadedly connecting the connection assembly to the backplate, the interval between the base plate assembly and the backplate may be adjusted by moving the connection assembly relative to the backplate. Therefore, the adjustment of a relative position of the base plate assembly and the target may be realized, so that the size of the target magnetic gap can be adjusted according to the requirements or actual conditions. Moreover, since the above adjustment can be realized only by rotating the above connection assembly, the adjustment method may be more convenient, which improves work efficiency.

The PVD apparatus of embodiments of the present disclosure, by using the above-mentioned PVD chamber of embodiments of the present disclosure, not only realizes the adjustment of the relative position of the base plate assembly and the target, but also adjusts the target magnetic gap according to the requirements or actual conditions. The adjustment method is more convenient, which improves the work efficiency.

BRIEF DESCRIPTION OF THE DRAWINGS

The accompanying drawings described herein are used to provide a further understanding of the present disclosure and constitute a part of the present disclosure. The exemplary embodiments of the present disclosure and their descriptions are used to explain the present disclosure and do not constitute an improper limitation of the present disclosure.

DETAILED DESCRIPTION OF THE EMBODIMENTS

In order to make the objectives, technical solutions, and advantages of the present disclosure clearer, the technical solutions of the present disclosure are clearly and completely described below in connection with specific embodiments of the present disclosure and the corresponding drawings. Apparently, described embodiments are only some, but not all, embodiments of the present disclosure. Based on embodiments of the present disclosure, all other embodiments obtained by those of ordinary skill in the art without creative efforts shall be within the scope of the present disclosure.

Figure 1:
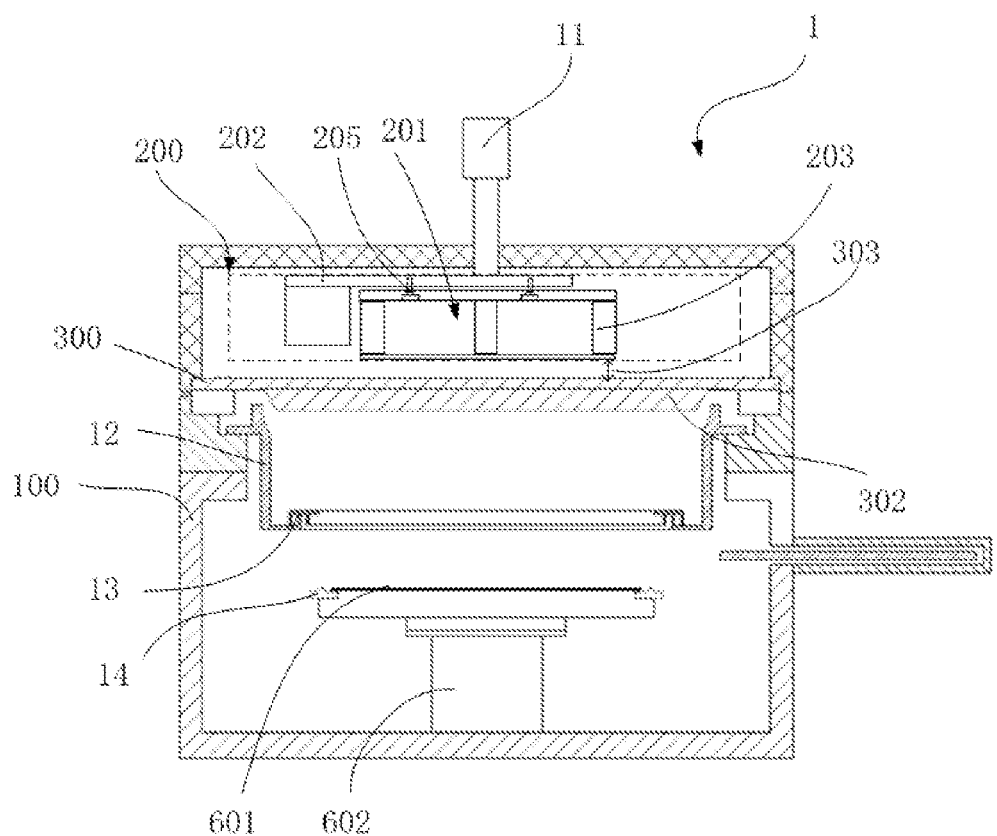
FIG. 1 is a schematic diagram of a physical vapor deposition (PVD) chamber according to some embodiments of the present disclosure.

FIG. 1 is a schematic diagram of a physical vapor deposition (PVD) chamber 1 (hereinafter, simply referred to as chamber 1) according to an embodiment of the present disclosure.

As shown in FIG. 1, the chamber 1 includes a chamber body 100, a target support plate 300 arranged above the chamber body 100, and an upper electrode assembly 200 arranged above the target support plate 300. Specifically, the upper electrode assembly 200 includes a base plate assembly 201 and a backplate 202 that is arranged at an interval from and connected to the base plate assembly 201. The base plate assembly 201 may be configured to carry a magnetron 203. The target support plate 300 is arranged on a side of the base plate assembly 201 away from the backplate 202. The target 302 is mounted on a side of the target support plate 300 away from the base plate assembly 201.

The chamber 1 further includes a motor 11 that is configured to drive the magnetron 203 to rotate and other components such as a liner 12, a cover plate 13, and a deposition ring 14 that are configured to avoid atomic contamination of an inner environment of the chamber 1. These components have a low degree of correlation with the concept of the present disclosure and are not described here.

Figure 2:
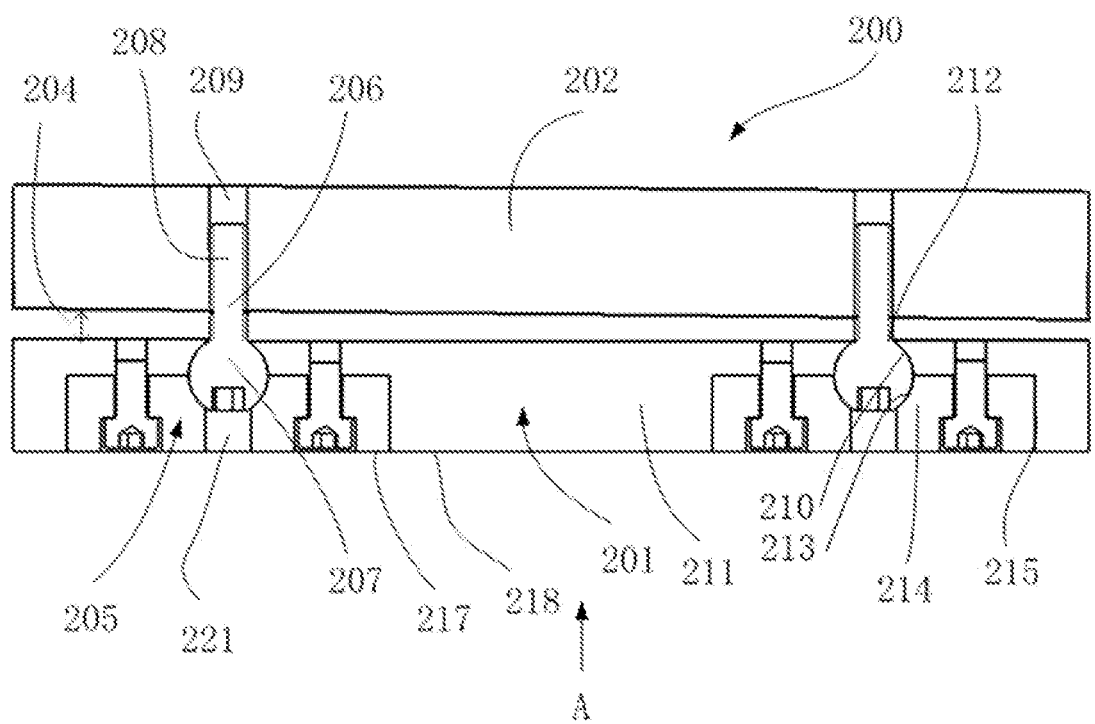
FIG. 2 is a schematic diagram of an upper electrode assembly according to some embodiments of the present disclosure.

In addition, a target magnetic gap 303 is provided between the target support plate 300 and the magnetron 203. By adjusting the target magnetic gap 303, a magnitude of a magnetic field force applied by the magnetron 203 to the atoms that escape from the target 302 may be adjusted. Thus, the atoms may form a film well at a predetermined deposition position. In order to conveniently adjust the target magnetic gap 303, in the embodiment, as shown in FIG. 2, the upper electrode assembly 200 includes a base plate assembly 201 that carries the magnetron 203, a backplate 202 that is arranged at an interval from the base plate assembly 201, and a connection assembly 205 that connects the base plate assembly 201 to the backplate 202. The connection component 205 may be connected to the base plate assembly 201, and the connection component 205 may be threadedly connected to the backplate 202. Thus, a size of an interval 204 between the base plate assembly 201 and the backplate 202 may be adjusted by moving the connection assembly 205 relative to the backplate 202.

As such, the adjustment of the relative position of the base plate assembly 201 and the target 302 may be realized, so that the size of the target magnetic gap 303 may be adjusted according to the requirements or actual conditions. Moreover, the above adjustment may be realized only by rotating the above-mentioned connection assembly 205. Thus, the adjustment method may be more convenient, which improves the work efficiency.

In the embodiment, the above-mentioned connection assembly 205 includes a connection bolt 206. The connection bolt 206 includes a bolt head 207 and a bolt 208. The bolt head 207 may be connected to the base plate assembly 201. The bolt 208 may be threadedly connected to the backplate 202.

As such, when the chamber 1 (or the PVD apparatus 6 including the chamber 1) of the present disclosure is used, the position of the base plate assembly 201 relative to the backplate 202 may be adjusted by adjusting a connection length (i.e., a length of the threaded connection) of the bolt 208 of the connection bolt 206 and the back plate 202. Thus, the size of the target magnetic gap 303 may be adjusted conveniently. In a specific embodiment, the backplate 202 is provided with a threaded hole 209. The bolt 208 of the connection bolt 206 is provided with an external thread that cooperates with the threaded hole 209. As such, the bolt 208 of the connection bolt 206 may be threadedly connected to the threaded hole 209.

Figure 3:
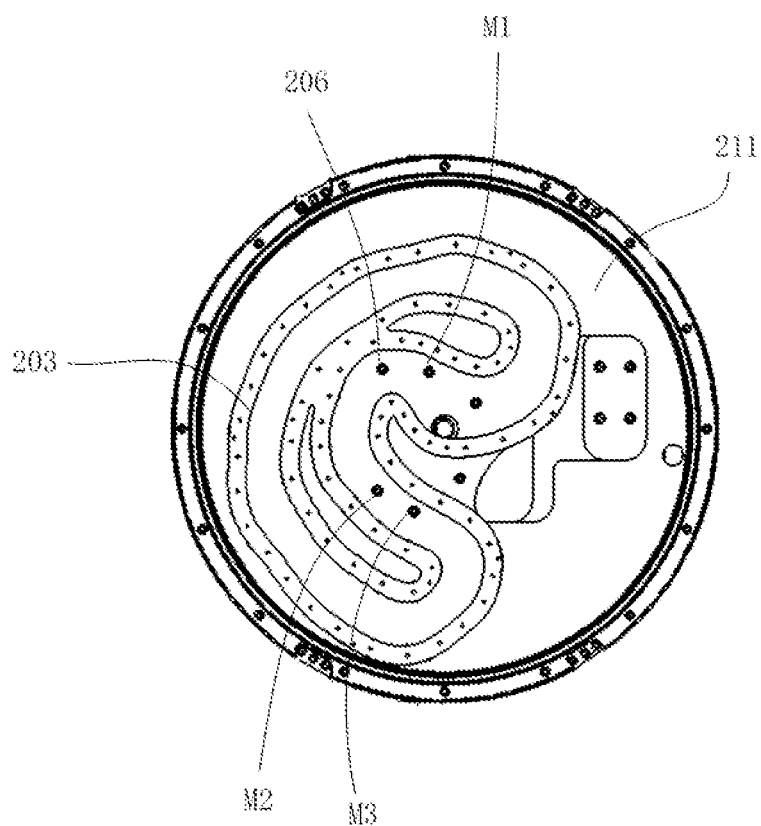
FIG. 3 is a schematic diagram of FIG. 2 in direction A.

In one embodiment, as shown in FIG. 3, a plurality of connection assemblies 205 are included. The plurality of connection assemblies 205 are arranged at intervals. Each connection assembly 205 is staggered from the magnetron 203. By arranging the plurality of connection assemblies 205 at intervals, the base plate assembly 201 and the backplate 202 may be connected together more stably. Moreover, the target magnetic gap 303 may be kept constant when the connection assemblies 205 (e.g., the connection bolts 206) are not adjusted. Thus, the magnetron 203 may be helped to provide a stable magnetic field to support good film formation. In addition, by staggering each connection assembly 205 from the magnetron 203, impacts on the installation of the magnetron 203 and the provision of the magnetic field may be avoided. In a specific embodiment, a number of the connection bolts 206 may be six. Thus, the base plate assembly 201 and the backplate 202 may be connected together by six connection bolts 206 arranged at intervals. It can be understood that when the target magnetic gap 303 is adjusted, each of these connection assemblies 205 may need to be adjusted.

In one embodiment, the bolt head 207 of the connection bolt 206 may be rotatably connected to the base plate assembly 201. As such, an inclination angle of the base plate assembly 201 relative to a plane where the backplate 202 is located may be adjusted within a certain range. Thus, the interval 204 between the base plate assembly 201 and the backplate 202 may be adjusted to have an equal distance. Especially, when the plurality of the connection assemblies 205 (e.g., the connection bolts 206) are included, and the distance 204 between the base plate assembly 201 and the backplate 202 does not have an equal distance, by adjusting a connection length of one of the connection bolts 206 (e.g., the connection bolt at position M1 in FIG. 3) an the backplate 202, the base plate assembly 201 may be raised or lowered driven by the connection bolt at the position Ml. Meanwhile, the base plate assembly 201 may drive bolt heads 207 of other connection bolts 206 (e.g., the connection bolts at position M2 and M3 in FIG. 3) to rotate relative to the base plate assembly 201 during the movement process. Thus, the interval 204 between the base plate assembly 201 and the backplate 202 may be automatically adjusted to have an equal distance (the above adjustment process is simply referred to as a leveling of the magnetron 203). It should be understood that during the leveling process of the magnetron 203, one or more connection bolts 206 may need to be adjusted. In addition, a measurement tool, such as a vernier caliper, may also be used to measure the distance 204 between the base plate assembly 201 and the backplate 202 to accelerate the leveling of the magnetron 203.

Figure 4:
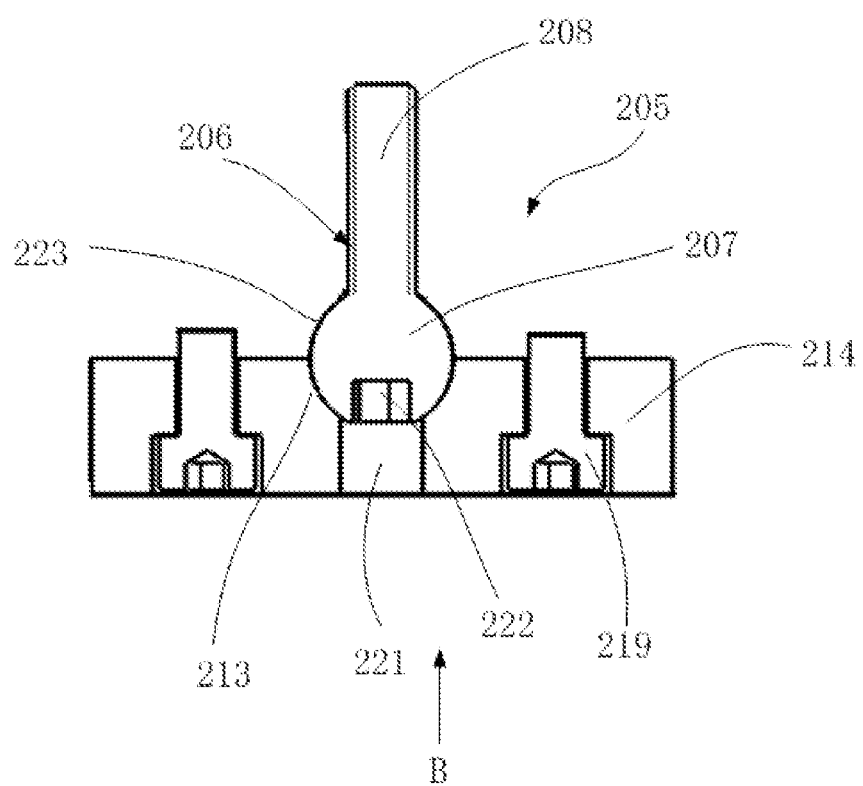
FIG. 4 is a schematic structural diagram of a connection assembly according to some embodiments of the present disclosure.

The method of rotation of the bolt head 207 of the above-mentioned connection bolt 206 relative to the base plate assembly 201 may include, for example, a universal rotation. The above-mentioned bolt head 207 may have various structures to realize the rotation method. For example, as shown in FIG. 4, the bolt head 207 is constructed as a convex spherical surface 223. As shown in FIG. 2, the base plate assembly 201 includes a base plate body 211. A first groove having a first concave spherical surface 210 is arranged in the base plate body 211. The bolt head 207 is arranged in the first groove. The convex spherical surface 223 cooperates with the first concave spherical surface 210. As such, the connection between the connection bolt 206 and the base plate assembly 201 may be a spherical connection. The spherical connection can realize the universal rotation, which further facilitates the leveling of the magnetron 203. It should be understood that the convex spherical surface 223 may be an entire spherical surface or a partial spherical surface. Correspondingly, the first concave spherical surface 210 of the first groove may be an entire spherical surface or a partial spherical surface.

In a specific embodiment, the opening end 212 of the first groove is located on the first surface of the base plate body 211 opposite to the backplate 202 (i.e., the upper surface of the base plate body 211 in FIG. 2). The bolt 208 is located on the outside of the base plate body 211 and is threadedly connected to the backplate 202. As seen overall, the connection bolt 206 is generally a ball-shaped screw. As such, in an assembly state of the base plate assembly 201 and the backplate 202, the bolt head 207 of the connection bolt 206 can be stably engaged in the first groove, and will not come out of the first groove. Thus, the base plate assembly 201 may be stably mounted to a bottom of the backplate 202 through the connection bolt 206.

It should be noted that, in practical applications, the position of the opening end of the first groove is not limited to being arranged on the first surface, but can also be located inside the base plate body 211, that is, on an inner side of the first surface. In this case, a through-hole may be arranged in the base plate body 211. One end of the through-hole may be communicated with the opening end of the first groove. The other end may be located on the first surface. The diameter of the through-hole may be smaller than the diameter of the convex spherical surface 223. The bolt 208 may extend from the through-hole and be threadedly connected to the backplate 202.

In one embodiment, as shown in FIG. 2, the base plate assembly 201 further includes a fixing module 214. The fixing module 214 may be detachably connected to the base plate body 211. The fixing module 214 is provided with a second groove having a second concave spherical surface 213. The second concave spherical surface 213 and the first concave spherical surface 210 may be aligned to form a continuous concave spherical surface. The bolt head 207 is fixed between the first groove and the second groove. The convex spherical surface 223 may cooperate with the first concave spherical surface 210 and the second concave spherical surface 213. That is, when the fixing module 214 is added, the concave spherical surface cooperating with the convex spherical surface 223 may have a split structure, that is, may be formed by aligning the second concave spherical surface 213 and the first concave spherical surface 210. It is easy to understand that when the fixing module 214 is not provided, the first concave spherical surface 210 included in the first groove in the above-mentioned base plate body 211 may be an integrated structure. The convex spherical surface 223 may only cooperate with the first concave spherical surface 210.

As such, the fixing module 214 and the base plate body 211 can fix the bolt head 207 therebetween, so that the connection between the connection bolt 206 and the base plate body 211 may be more stable. In addition, by detachably connecting the fixing module 214 to the base plate body 211, the assembly of the connection bolt 206 can be more convenient. For example, when the base plate body 211 is assembled, first, the bolt head 207 of the connection bolt 206 may be placed in the first groove on the base plate body 211. Then, the fixing module 214 may be connected to the base plate body 211, so that the first concave spherical surface 210 of the first groove may be aligned with the second concave spherical surface 213 of the second groove of the fixing module 214 to form a continuous concave spherical surface. The first groove and the second groove may jointly accommodate the bolt head 207 in the continuous concave spherical surface. In addition, the second concave spherical surface 213 and the first concave spherical surface 210 may cooperate with the convex spherical surface 223 of the bolt head 207. As such, the fixing module 214, the base plate body 211, and the connection bolts 206 may form as a whole (i.e., form the base plate assembly 201). Then, the base plate assembly 201 may be mounted at the backplate 202 as a whole through the bolt 208 of the connection bolt 206. During this process, the fixing function of the fixing module 214 on the connection bolt 206 can prevent the connection bolt 206 from being disengaged from the base plate body 211, thereby facilitating the assembly of the base plate assembly 201. It should be understood that the base plate body 211 may include other devices, such as devices used for magnetron sputtering, which is not repeated here.

In a specific embodiment, as shown in FIG. 2, a recess 215 is formed at the base plate body 211. The fixing module 214 is embedded in the recess 215. The surface 217 of the fixing module 214 exposed to the base plate body 211 is flush with the second surface 218 of the base plate body 211 facing away from the above-mentioned first surface. As such, when seen as a whole, the second surface 218 of the base plate body 211 and the surface 217 of the fixing module 214 form a substantial plane, which facilitates arranging various devices on the base plate body 211, such as the magnetron 203.

In one embodiment, as shown in FIG. 4, the fixing module 214 is provided with an operation hole 221. One end of the operation hole 221 is communicated with the second groove. The other end is located on the surface 217 of the fixing module 214 exposed to the base plate body 211. An operation slot 222 is arranged at the bolt head 207 corresponding to the operation hole 221. As such, when the bolt head 207 of the connection bolt 206 cooperates with the second concave spherical surface 213 of the second groove, an operator can still operate the convex spherical surface 223 through the operation hole 221. Thus, the leveling of the magnetron 203 may be performed, or the interval 204 between the base plate assembly 201 (e.g., the base plate body 211) and the backplate 202 may be adjusted. For example, the operator may use a screwdriver to cooperate with the operation slot 222 through the operation hole 221 to screw the connection bolt 206 to achieve the leveling of the magnetron 203.

Figure 5:
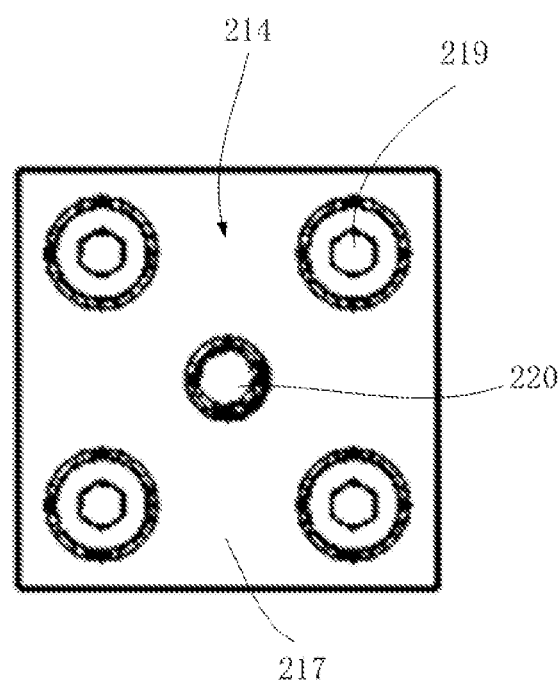
FIG. 5 is a schematic structural diagram of FIG. 4 in direction B.

In a specific embodiment, the detachable connection method of the fixing module 214 and the base plate body 211 may be, for example, a fixed connection through screws 219. More specifically, as shown in FIG. 5, a plurality of the screws 219 are included and arranged at intervals evenly around the operation hole 220 in a circumferential direction. In another specific embodiment, four screws 219 are included and are evenly arranged at intervals around the operation hole 220 in the circumferential direction. As such, the fixing module 214 can be stably mounted at the base plate body 211. It should also be understood that although the surface 217 of the fixed module 214 shown in FIG. 5 is generally square, the surface 217 of the fixed module 214 can actually be any other suitable shape, such as a rectangle, a diamond, a circle, etc.

Figure 6:
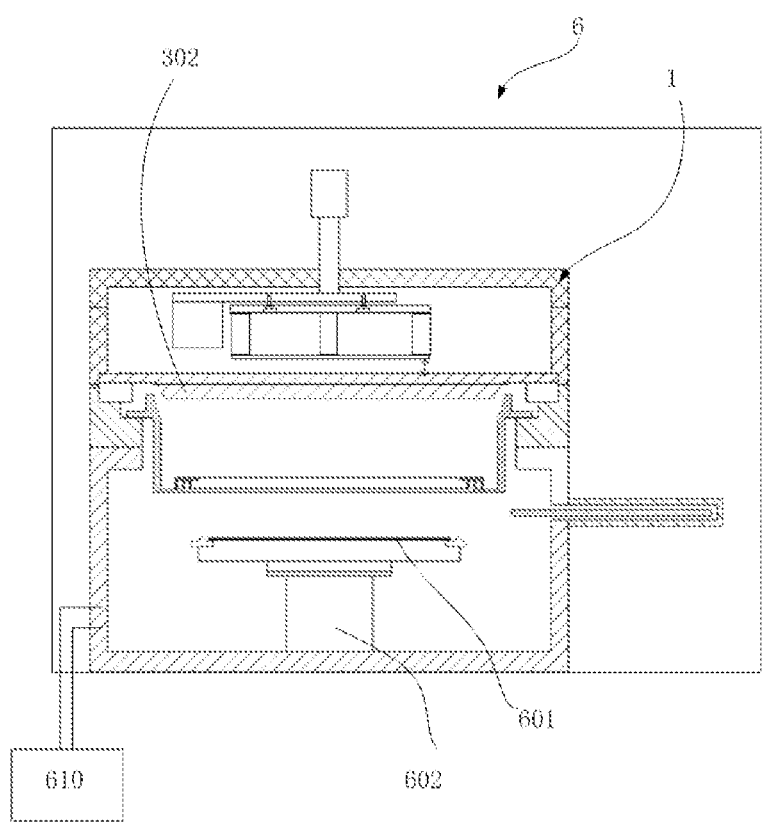
FIG. 6 is a schematic diagram of a PVD apparatus according to some embodiments of the present disclosure.

FIG. 6 is a schematic diagram of a PVD apparatus 6 according to some embodiments of the present disclosure. The PVD apparatus 6 includes the PVD chamber 1 described above. In addition, the PVD apparatus 6 further includes a vacuuming device 610. In the PVD chamber 1, a base 602 carrying a wafer 601 may also be provided. During the sputtering process, atoms escaping from the target 302 will eventually deposit on the wafer 601 and form a film.

Figure 7A:
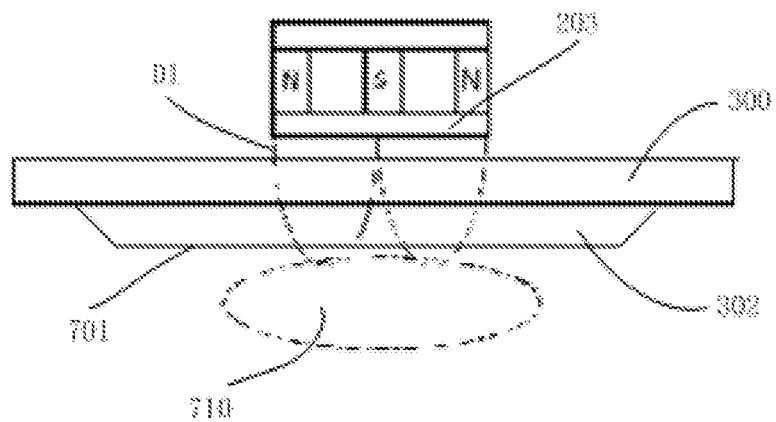
FIGS. 7a, 7b, and 7c are schematic diagrams showing adjusting an assembly of a magnetron device while using the PVD apparatus according to some embodiments of the present disclosure.
Figure 7B:
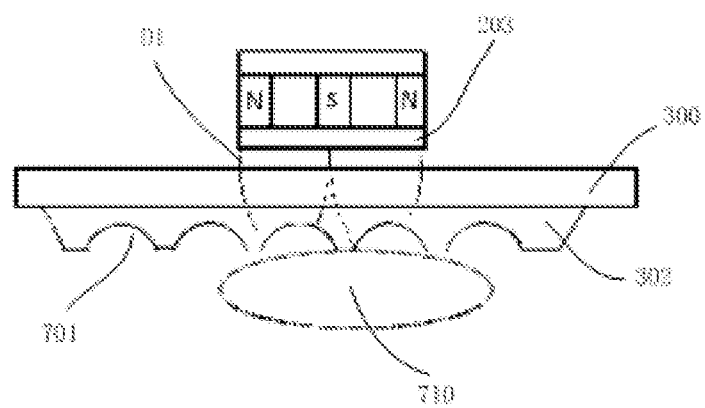
Figure 7C:
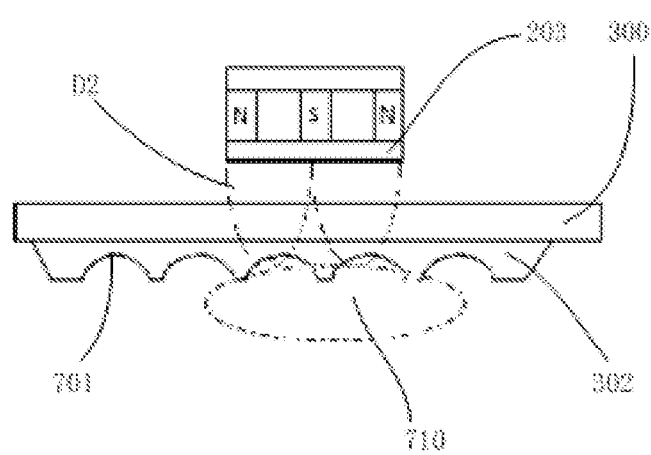

As the target 302 is consumed, the base plate assembly 201 may be adjusted in a direction away from the target 302 every once in a while. As shown in FIGS. 7A to 7C, in an initial state (as shown in FIG. 7A), the target magnetic gap 303 between the magnetron 203 of the base plate assembly 201 and the target support plate 300 is D1. A distance between an eroded surface 701 of the target 302 and the magnetron 203 is appropriate. After the target 302 is used for a period of time, the target magnetic gap 303 may still be D1. The distance between the eroded surface 701 of the target 302 and the magnetron 203 may become smaller due to the continuous escape of atoms on the target 302. In this case, the magnetic field strength of the magnetic field 710 at the eroded surface 701 may become larger, which is not beneficial for the effective utilization of the target 302 (as shown in FIG. 7B). By adjusting the base plate assembly 201 toward the backplate 202 (i.e., the direction away from the target 302), the target magnetic gap 303 may become D2, and D2 may be greater than D1. Thus, the distance between the eroded surface 701 of the target 302 and the magnetron 203 may be appropriate again (as shown in FIG. 7C). Therefore, the magnetic field intensity at the eroded surface of the target 302 can always be kept within an appropriate range to avoid the increase of the magnetic field intensity at the eroded surface as the target 302 is consumed. Thus, the target 302 may be eroded faster and faster. Thereby, the effective utilization rate of the target 302 may be improved.

In addition, leveling the magnetron 203 may prevent the eroded surface 701 of the target material 302 from having different magnetic field intensities. Thus, the probability of uneven consumption of the target 302 may be reduced, which also helps to improve the effective utilization rate of the target 302.

The above descriptions are merely embodiments of the present disclosure, which are not intended to limit the present disclosure. For those skilled in the art, various modifications and changes may be made to the present disclosure. Any modifications, equivalent replacements, improvements, etc., made within the spirit and principle of the present disclosure shall be within the scope of the claims of the present invention.

What is claimed is:

1. A physical vapor deposition (PVD) chamber, comprising a chamber body, and an upper electrode assembly being arranged in the chamber body and including:
   a base plate assembly configured to carry a magnetron;
   a backplate arranged at an interval with the base plate assembly; and
   a connection assembly for connecting the base plate assembly to the backplate, the backplate being arranged on a side of the base plate assembly away from the magnetron;
   wherein:
      the connection assembly includes a connection bolt;
      a bolt head of the connection bolt is connected to the base plate assembly;
      a bolt is threadedly connected to the backplate, and
      the bolt head is located inside the base plate assembly, an operation hole is arranged on a side of the base plate assembly away from the backplate to expose the bolt head, and an operation slot is arranged at the bolt head corresponding to the operation hole.

2. The PVD chamber according to claim 1, wherein a plurality of connection assemblies are included and arranged at intervals from the magnetron.

3. The PVD chamber according to claim 2, wherein the bolt head is rotatably connected to the base plate assembly.

4. A physical vapor deposition (PVD) chamber, comprising a chamber body, and an upper electrode assembly being arranged in the chamber body and including:
   a base plate assembly configured to carry a magnetron;
   a backplate arranged at an interval with the base plate assembly; and
   a connection assembly for connecting the base plate assembly to the backplate, the backplate being arranged on a side of the base plate assembly away from the magnetron;
   wherein:

the connection assembly includes a connection bolt;
a bolt head of the connection bolt is connected to the base plate assembly;
a bolt is threadedly connected to the backplate;
a plurality of connection assemblies are arranged at intervals from the magnetron;
the bolt head is rotatably connected to the base plate assembly;
the bolt head is configured to have a convex spherical surface; and
the base plate assembly includes a spherical base cooperating with the convex spherical surface.

5. The PVD chamber according to claim 4, wherein:
the base plate assembly includes a base plate body, the spherical base and a through-hole communicating with the spherical base being formed at the base plate body, the convex spherical surface of the connection bolt cooperating inside the spherical base, the bolt being extended from the through-hole, and a diameter of the convex spherical surface being greater than a diameter of the through-hole.

6. The PVD chamber according to claim 5, wherein the base plate assembly further includes a fixing module having a concave spherical surface that cooperates with the convex spherical surface, the fixing module being fixed at the base plate body, and the concave spherical surface cooperating with the convex spherical surface.

7. The PVD chamber according to claim 6, wherein:
a recess is formed at the base plate body;
the spherical base is formed at a bottom surface of the recess;
the fixing module is embedded in the recess; and
a surface of the fixing module is flush with a surface of the base plate body.

8. The PVD chamber according to claim 7, wherein:
an operation hole is provided at the fixing module and is communicated with the convex spherical surface; and
an operation slot corresponding to the operation hole is provided on the convex spherical surface.

9. The PVD chamber according to claim 8, wherein:
the fixing module is fixedly connected to the base plate body by screws.

10. A physical vapor deposition (PVD) apparatus, comprising the PVD chamber, the PVD chamber including a chamber body, and an upper electrode assembly being arranged in the chamber body and including:
a base plate assembly configured to carry a magnetron;
a backplate arranged at an interval with the base plate assembly; and
a connection assembly for connecting the base plate assembly to the backplate, the backplate being arranged on a side of the base plate assembly away from the magnetron;
wherein:
the connection assembly includes a connection bolt;
a bolt head of the connection bolt is connected to the base plate assembly;
a bolt is threadedly connected to the backplate, and
the bolt head is located inside the base plate assembly, an operation hole is arranged on a side of the base plate assembly away from the backplate to expose the bolt head, and an operation slot is arranged at the bolt head corresponding to the operation hole.

11. The PVD apparatus according to claim 10, wherein a plurality of connection assemblies are arranged at intervals from the magnetron.

12. The PVD apparatus according to claim 11, wherein the bolt head is rotatably connected to the base plate assembly.

13. The PVD apparatus according to claim 12, wherein:
the bolt head is configured to have a convex spherical surface; and
the base plate assembly includes a spherical base cooperating with the convex spherical surface.

14. The PVD apparatus according to claim 13, wherein:
the base plate assembly includes a base plate body, the spherical base and a through-hole communicating with the spherical base being formed at the base plate body, the convex spherical surface of the connection bolt cooperating inside the spherical base, the bolt being extended from the through-hole, and a diameter of the convex spherical surface being greater than a diameter of the through-hole.

15. The PVD apparatus according to claim 14, wherein the base plate assembly further includes a fixing module having a concave spherical surface that cooperates with the convex spherical surface, the fixing module being fixed at the base plate body, and the concave spherical surface cooperating with the convex spherical surface.

16. The PVD apparatus according to claim 15, wherein:
a recess is formed at the base plate body;
the spherical base is formed at a bottom surface of the recess;
the fixing module is embedded in the recess; and
a surface of the fixing module is flush with a surface of the base plate body.

17. The PVD apparatus according to claim 16, wherein:
the operation hole is provided at the fixing module and is communicated with the convex spherical surface; and
the operation slot is provided on the convex spherical surface.

18. The PVD apparatus according to claim 17, wherein:
the fixing module is fixedly connected to the base plate body by screws.

* * * * *